(12) United States Patent
Kwon et al.

(10) Patent No.: US 10,247,971 B2
(45) Date of Patent: Apr. 2, 2019

(54) FLEXIBLE ORGANIC LIGHT EMITTING DISPLAY DEVICE AND METHOD FOR MANUFACTURING THE SAME

(71) Applicant: LG Display Co., Ltd., Seoul (KR)

(72) Inventors: Seyeoul Kwon, Goyang-si (KR); Sang Hyeon Kwak, Paju-si (KR); Sangcheon Youn, Seoul (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 15/653,196

(22) Filed: Jul. 18, 2017

(65) Prior Publication Data

US 2017/0315399 A1 Nov. 2, 2017

Related U.S. Application Data

(63) Continuation of application No. 14/179,211, filed on Feb. 12, 2014, now Pat. No. 9,740,035.

(Continued)

(30) Foreign Application Priority Data

Nov. 29, 2013 (KR) .................. 10-2013-0146988

(51) Int. Cl.
*H01L 51/00* (2006.01)
*H01L 27/32* (2006.01)
(Continued)

(52) U.S. Cl.
CPC ...... *G02F 1/133305* (2013.01); *G02F 1/1345* (2013.01); *H01L 27/124* (2013.01);
(Continued)

(58) Field of Classification Search
CPC ........ G02F 1/133305; G02F 1/1345–1/13454; G02F 1/13458; H05K 1/0277–1/0283;
(Continued)

(56) References Cited

U.S. PATENT DOCUMENTS 7,629,691 B2 12/2009 Roush et al.
9,287,342 B2 * 3/2016 Kwon .................. H01L 27/3276
(Continued)

FOREIGN PATENT DOCUMENTS

JP 2004212587 7/2004
KR 20100018006 2/2010

OTHER PUBLICATIONS

Office Action for Chinese Patent Application No. CN 201480008791.0, dated Dec. 28, 2016, 18 Pages.
(Continued)

*Primary Examiner* — Mariceli Santiago

(74) *Attorney, Agent, or Firm* — Fenwick & West LLP

(57) ABSTRACT

There is provided a flexible display having a new wire structure and a new insulating layer structure. A flexible display includes a flexible substrate having a first area and a second area. The second area is curved in a non-zero angle relative to the plane of the first area. The flexible display further includes a plurality of wires that extend over from the first area to the second area of the flexible substrate. Each of the wires is covered by an upper insulating pattern, which is separated from other upper insulating pattern. Each upper insulating pattern covering the wire has substantially the same trace pattern shape of the corresponding wire thereunder. Accordingly, by adopting the above-described wire structure and upper insulating layer structure, crack generation and propagation in the wires and the insulating layers from bending of the flexible display can be minimized.

12 Claims, 8 Drawing Sheets

Related U.S. Application Data

(60) Provisional application No. 61/765,253, filed on Feb. 15, 2013.

(51) Int. Cl.
 *G02F 1/1333* (2006.01)
 *H01L 27/12* (2006.01)
 *G02F 1/1345* (2006.01)

(52) U.S. Cl.
 CPC ...... *H01L 27/1218* (2013.01); *H01L 27/3276* (2013.01); *H01L 51/0097* (2013.01); *H01L 2251/5338* (2013.01); *Y02E 10/549* (2013.01)

(58) Field of Classification Search
 CPC ......... H01L 51/0097; H01L 2251/5338; H01L 27/3297; H01L 27/3276; G06F 1/1616; G06F 1/1641; G06F 1/1652
 See application file for complete search history.

(56) References Cited

U.S. PATENT DOCUMENTS

| | | | |
|---|---|---|---|
| 9,600,112 B2* | 3/2017 | Zhang | G06F 1/169 |
| 9,659,966 B2* | 5/2017 | Kwak | H01L 27/1218 |
| 2004/0192082 A1 | 9/2004 | Wagner et al. | |
| 2005/0280157 A1* | 12/2005 | Roush | H01L 23/4985 257/773 |
| 2011/0248309 A1 | 10/2011 | Han et al. | |
| 2011/0267284 A1 | 11/2011 | Lee et al. | |
| 2012/0062447 A1* | 3/2012 | Tseng | G02F 1/133305 345/33 |
| 2013/0082984 A1* | 4/2013 | Drzaic | G09G 3/20 345/204 |
| 2014/0049449 A1 | 2/2014 | Park et al. | |
| 2014/0097408 A1* | 4/2014 | Kim | H01L 27/3237 257/40 |
| 2014/0217373 A1* | 8/2014 | Youn | H01L 23/4985 257/40 |

OTHER PUBLICATIONS

European Search Report for European Patent Application No. EP 14 751992.0, dated Sep. 9, 2016, 9 Pages.
PCT International Search Report for PCT/KR2014/001198, dated May 28, 2014, 3 Pages.
Office Action for U.S. Appl. No. 14/179,211, dated Nov. 17, 2016, 11 Pages.
Office Action for U.S. Appl. No. 14/179,211, dated May 25, 2016, 11 Pages.

* cited by examiner

FLEXIBLE ORGANIC LIGHT EMITTING DISPLAY DEVICE AND METHOD FOR MANUFACTURING THE SAME

CROSS-REFERENCE TO RELATED APPLICATIONS

This application is a continuation of U.S. patent application Ser. No. 14/179,211 filed on Feb. 12, 2014 which claims priority under 35 U.S.C. § 119(e) to U.S. Provisional Patent Application No. 61/765,253 filed on Feb. 15, 2013, and under 35 U.S.C. § 119(a) to Korean Patent Application No. 10-2013-0146988 filed on Nov. 29, 2013, each of which are incorporated herein by reference in its entirety.

BACKGROUND

Technical Field

The present invention relates to the field of electronic displays, and more particularly to novel configurations for reducing mechanical strain in the manufacture and/or use of a flexible organic light-emitting display device.

Description of the Related Art

Flexible display, which can be bent without losing its functionality, is gaining significant attention as the next generation display technology because it provides several advantages over the conventional rigid displays. Features offered by the flexible displays include slimmer form factor, lighter weight, increased durability, and most of all, freedom to design unique electronic devices, which could not be achieved with conventional rigid displays. Generally, flexible substrates, such as very thin plastic or glass substrates, are used to provide mechanical flexibility necessary for the flexible displays. Once various components are formed on the flexible substrate, the flexible substrate can be placed on or even be wrapped around a base device and/or a support structure to manufacture a flexible display. As such, a range of revolutionary display devices, such as televisions with a curvature adjustable screen as well as portable electronics with a rollable display screen, can be manufactured by using the flexible display.

Despite significant technological advances, various challenges still remain in the field of flexible displays. In particular, manufacturing process for devices equipped with the flexible displays and the continuous flexing of such devices result in mechanical strain to various components in the flexible display. For example, the flexible display may need to be bent at or wrapped around an edge of a base structure, requiring a very small radius of curvature at the bent portion of the flexible display. Also, the flexible display may be tightly rolled or folded during the actual use of the device employing the flexible display. In such cases, several components of the flexible display are subjected to mechanical strain. Especially, wires and/or electrodes for such devices are usually sensitive to tensile, compression and/or shear stress, and thus the wires positioned at the bent portion of the flexible display are prone to crack/fracture when subjected to such mechanical stress.

Attempts have been made to reduce the crack and fracture of wires in the flexible displays. Most prior attempts were aimed at forming the wires with more ductile material or increasing the size of the wires to withstand the mechanical strain. Some methods involved adjusting the thickness of layers neighboring the wires or forming additional layers on or below the wires, so that the wires are within the neutral plane during the bending of the flexible display. However, the methods described above increases the thickness of the resulting display, and may even make it difficult to bend the flexible display to small radius of curvature. Therefore, such methods could not resolve the crack and fracture for the components positioned at a severely bent part such as the edge of the flexible display.

Accordingly, alleviating the mechanical stress on various components from the bending during manufacturing and/or using the flexible display is one of the major concerns in various devices employing the flexible display.

BRIEF SUMMARY

The inventors of the embodiments disclosed herein have recognized that simply reducing the mechanical stress to the wires themselves will not adequately solve the crack generation problem in the various circuitry of the flexible display. In particular, layers disposed on or below the wires, for example the insulation layers that cover the wires, are still subjected to the mechanical strain from bending of the flexible display. Such layers often include organic/inorganic materials that are usually less ductile than the metals that form the wires. Even when the mechanical strain to the wires is reduced, cracks in the layers above and/or below the wires can propagate to the wires, thereby creating spots of poor electrical contact that render the flexible display unusable.

Accordingly, a novel flexible display and its configuration for enhanced flexibility and reduced occurrences of components failure from the mechanical strain are provided herein.

In an aspect, the present disclosure relates to a configuration of an insulating layer and a wire of a flexible display, which is adapted for reducing the mechanical strain to both the insulating layer and the wire at the same time.

In an embodiment, a flexible OLED (organic light emitting diode) display includes a flexible substrate having a display area and a bending area adjacent to the display area. On the display area, a display unit having a thin-film transistor and an OLED element is disposed therein. A wire, which is electrically connected to the display unit is arranged to cross over into the bending area of the flexible substrate. The wire has a trace pattern arranged in an orthogonal direction relative to a boundary between the display area and the bending area of the flexible substrate. An upper insulating pattern covers the wire. The upper insulating pattern has substantially the same trace pattern shape as the wire covered thereunder.

The flexible OLED display may further include a lower insulating layer under the wire. The lower insulating layer may include a lower insulating pattern, which has substantially the same trace pattern shape as the wire covered by the lower insulating pattern. The trace pattern of the wire, the lower insulating pattern and the upper insulating pattern reduce the mechanical stress caused by bending of the flexible substrate during manufacturing of the flexible OLED display or using of the device employing the flexible OLED display. Separation of individual insulating patterns in the lower and upper insulating layers inhibits propagation of cracks/fracture.

In another embodiment, a flexible display includes a flexible substrate having a first area and a second area. The second area is curved in a non-zero angle relative to the plane of the first area. The flexible display further includes a plurality of wires that extend over from the first area to the second area of the flexible substrate. Each of the wires is covered by an upper insulating pattern, which is separated from other upper insulating pattern. Each upper insulating pattern covering the wire has substantially the same trace pattern shape as the corresponding wire thereunder.

On either one or both of the first and second areas, a display unit including a plurality of organic light-emitting diode elements and a touch sensor may be disposed. At least one of the wires crossing from the first area to the second area is electrically connected to the display unit and/or the touch sensor. Further, a cover glass may be disposed on at least one of the first and second areas of the flexible display.

Alternatively, a display unit including a liquid crystal panel, a light source and a light guide member may be disposed on either one or both of the first and second areas.

It should be noted that the embodiments described in the present disclosure are not intended to be bound or otherwise be limited by any express or implied theory presented in the preceding background and brief summary. It should also be appreciated that the following detailed description is merely exemplary in nature and is not intended to limit the embodiments or the application and uses thereof. Hereinafter, exemplary embodiments will be described in detail with reference to the accompanying drawings.

DETAILED DESCRIPTION OF THE PREFERRED EMBODIMENT

Figure 1A:
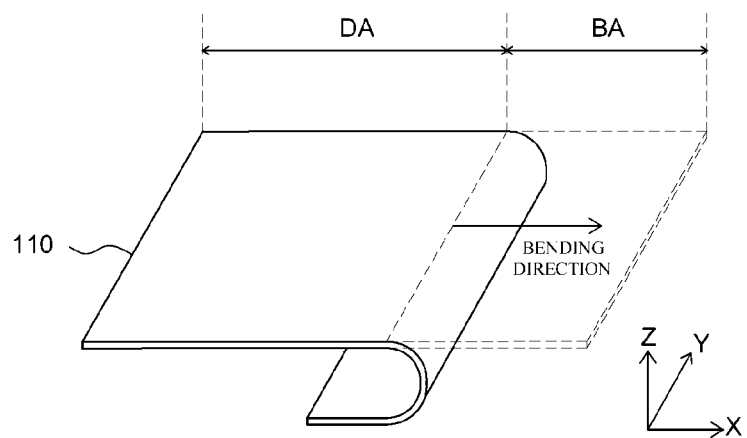
FIG. 1A is a perspective view of a flexible substrate being bent in a bending direction.

Various features and advantages described in the present disclosure will be more clearly understood from the following description with reference to the accompanying drawings. Note that the accompanying drawings are merely illustrative and may not be drawn to scale for easier explanation. Also, components having the same or similar function may be denoted by the corresponding reference symbols/numeral (e.g., 110, 210 and 310) throughout the drawings for describing various embodiments. The descriptions of the same or similar components may be omitted.

An electronic device may include a display. For example, a cellular telephone, tablet computer, notebook computer, computer monitor or other electronic device may have a display to display visual information such as text and images to users. The display may include a self-emitting organic light-emitting diode (OLED) display or a liquid crystal display along with a light source and light guide member. Such display may be formed on a flexible substrate such as a sheet of polymer, and serve as the flexible display. The flexible display may be attached to a support structure such as a flexible support layer, cover glass, housing and the like.

In the following description, a flexible display refers to a display that can be bent without losing its functionality. For instance, some parts of a flexible display may be bent during manufacturing of a device to form a curved display and/or folded edges. Also, the flexible display may be bent and straightened during actual use of the device that includes such display. Accordingly, a flexible display should be rugged and resilient enough to withstand several types of mechanical stress during manufacturing and usage. As such, the term "flexible display" in the present disclosure encompasses a curved display, a bendable display, a rollable display, a foldable display, a twistable display, a stretchable display and the like.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Further, it will be understood that when an element is referred to as being "overlapped" with another element, at least some portion of one element can be positioned above or below the other element. Moreover, although some of the elements are designated with numerical terms (e.g., first, second, third, etc.), it should be understood that such designations are only used to specify one element from a group of similar elements, but not to limit the element in any specific order. As such, an element designated as a first element could be termed as a second element or as third element without departing from the scope of exemplary embodiments.

Respective features of various exemplary embodiments of the present invention can be partially or totally joined or combined with each other and as sufficiently appreciated by those skilled in the art, various interworking or driving can be technologically achieved and the respective exemplary embodiments may be executed independently from each other or together executed through an association relationship. Hereinafter, various embodiments of the present invention will be described in detail with reference to the accompanying drawings.

Reference is first made to FIGS. 1A-1E, which illustrate an exemplary flexible organic light-emitting diode (OLED) display according to an embodiment of the present disclosure.

FIG. 1A illustrates an exemplary view of a flexible substrate that is bent in a direction, which is referred hereinafter as the "bending direction." A flexible OLED display 100 is formed on the flexible substrate 110. The flexible substrate 110 includes a substantially flat area, which extends in a plane. Apart of the flexible substrate 110 can be curved upward or downward in a bending direction so that it is curved away from the plane as shown in FIG. 1A. That is, any part of the flexible OLED display can be curved upward (positive direction in Z axis) or downward (negative direction in Z axis) relative to the XY plane.

Figure 1B:
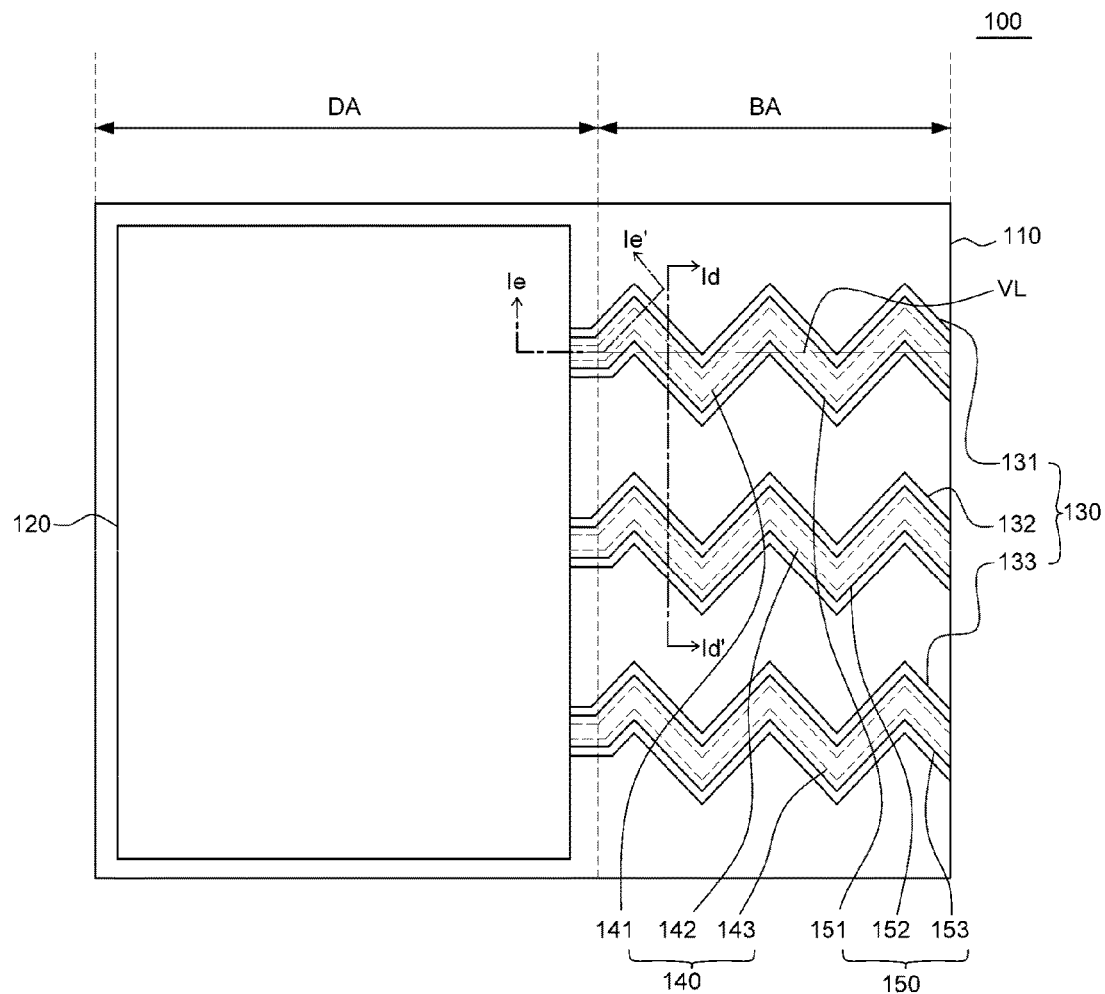
FIG. 1B is a plan view of an exemplary configuration of wires, upper insulating layers and lower insulating layers in a flexible organic light-emitting diode (OLED) display according to an embodiment of the present disclosure.

The flexible OLED display 100 may have a planar rectangular display area (DA) and a bending area (BA), which may be curved in a bending direction. In this example, a display unit 120, which includes active display pixels for displaying image content, is contained within the display area of the flexible substrate 110. The bending area may be the edge of the flexible substrate 100. This bending area may include wires 140 as depicted in FIG. 1B.

To enhance device aesthetics, visible area on the flexible substrate 110 that does not include the display unit 120 may be reduced by bending portions of the flexible substrate 110. For example, the edge of the flexible substrate 110 may be folded (wrapped) around an inner support structure (not shown) and/or other internal components of the electronic device. In such a case, the edges of flexible substrate 110 may be bent downwards (inwardly) at a non-zero angle with respect to the X-Y plane of the display area in the flexible display 110. In the illustrative example of FIG. 1A, bent edge portion of flexible substrate has been curved downwards from main planar display area (DA) at an angle of about 180° such that the part of the flexible substrate 110 lie underneath the plane of the display area. Other bend angles, for example, angles more than 90° or angles less than 90°, may be used if desired.

In this arrangement, the size of the bending area that does not include the display unit 120, which may be visible from the front of the flexible OLED display 100, can be minimized. Any minimal edge portion flexible substrate 100 that remains visible may be covered with a bezel (not shown) or an opaque masking layer (e.g., black matrix layer).

Although the display unit 120 is illustrated as being contained within the display area, the display unit 120 can be extended into the bending area or separate display unit(s) may be positioned in the bending area. Further, display unit 120 on the bent edges of the flexible substrate 110 can be covered by a transparent cover layer or a transparent housing (e.g., cover glass, polymer films, flexible substrates), and it can be used for displaying images to a user. In such configurations, less portion of the flexible substrate 100 needs to be covered by the bezel or by other means.

Further, such transparent cover layer and/or the housing may be provided with lensing capabilities to correct for optical distortions that may be caused by the separation between the display unit in the bending area and the cover glass layer. For example, optical distortions can be corrected by attaching lenses to the cover glass layer or by forming lenses in the cover glass layer. Also, the cover glass layer at the edge may be formed in a specific shape (e.g., appropriate curvature and thickness) and/or formed with an appropriate material so that the refraction of the light from the display unit 120 on the bending area of the flexible substrate 110 can be adjusted appropriately.

The flexible OLED display 100 includes one or more wires 140 (e.g., electrodes, circuitry) for routing signals between various components of the flexible OLED display 100 and/or external components. For instance, the wire 140 may transmit signals between a driving circuit (not shown) and the display unit 120 formed in the display area of the flexible substrate 110. The wire 140 can be disposed on the curved portion (e.g., bent display area and/or bent edge) of the flexible substrate 110. For electronic devices with touch sensing capabilities, components for a touch sensor (not shown) may be partially or fully disposed in the bent portion. For instance, the bent edge of flexible substrate 110 may be used for routing signals from the display and/or touch sensor panel to the circuitry of the electronic device.

Generally, greater mechanical stress (e.g., tensile stress, compression stress, shear stress) is exerted to the component from bending when the shape and/or the orientation of the component is more linear to the bending direction. In other words, a component that is oriented, or otherwise laid, in the direction closer to the bending direction experiences greater mechanical stress.

Accordingly, the wire 140 on the flexible substrate 100 may have a non-straight line trace pattern to withstand the mechanical stress caused by bending of the flexible substrate 110. For example, the wire 140 can have a zigzag trace pattern as depicted in FIG. 1B. In this way, at least the portion of the wire 140 arranged non-parallel to the bending direction will experience less mechanical stress during bending of the flexible substrate 110. The shape of trace pattern of the wire 140 is not limited to the zigzag shape, and the wire 140 may have various other trace shapes such as a triangle-wave shape, a sine-wave shape (i.e., rounded trace), a trapezoid-wave shape and the like. In some embodiments, the wire 140 can have a diamond trace pattern. The diamond trace pattern is particularly useful for more robust applications because it allows the electrical connection to be maintained even if one line segment of a diamond trace breaks. Other trace patterns might be more useful in cases where tight spacing between multiple wires is required.

Various types of insulating layers can be formed to cover at least some parts of the wire 140. Some insulating layer may serve to protect the wire 140 from external environments (e.g., moisture, gas, etc.), while some insulating layer provides impact resistance for the wire 140. Also, some insulating layer can be formed to cover the wire 140 for electrical insulation between the wire 140 and other components of the flexible OLED display 100. While the material for forming the insulating layer can vary depending on the functionality of the insulating layer, the vast majority of the insulating layers are often formed with an inorganic material, an organic material or a combination thereof.

However, such inorganic material and/or the organic material (which may be in a film form) are often less ductile than the material forming the wire 140 (e.g., metal). Accordingly, the insulating layers are often prone to crack and fracture from the mechanical stress caused by bending of the flexible substrate 110. Not only does a crack/fracture grow within a layer but it tends to propagate into an adjacent layer. When the insulating layer is formed over the entire flexible substrate 110 (or even the entire bending area), a crack in one area of the insulating layer can grow and extend into other areas of the insulating layer, and propagate further to the wire 140. As such, simply making the wire thicker or adding a layer to place the wire in the neutral plane does not fully resolve the crack/fracture problem in flexible OLED display.

In the flexible display 100 of the present disclosure, the lower insulating layer 130 and the upper insulating layer 150, which are formed below and above the wire 140, are carefully arranged to reduce the cracks in those insulating layers from the outset and to inhibit the crack propagation to the wire 140. That is, the lower insulating layer 130 is patterned such that each of the lower insulating patterns (131, 132 and 133) is formed along the trace of the wire 140. Similarly, the upper insulating layer 150 is also patterned such that each of the upper insulating patterns (151, 152 and 153) is formed along the trace pattern of the wire 140 (141, 142 and 143) as shown in FIG. 1B. The lower insulating patterns and the upper insulating patterns may be in direct contact with the corresponding wire.

Figure 1C:
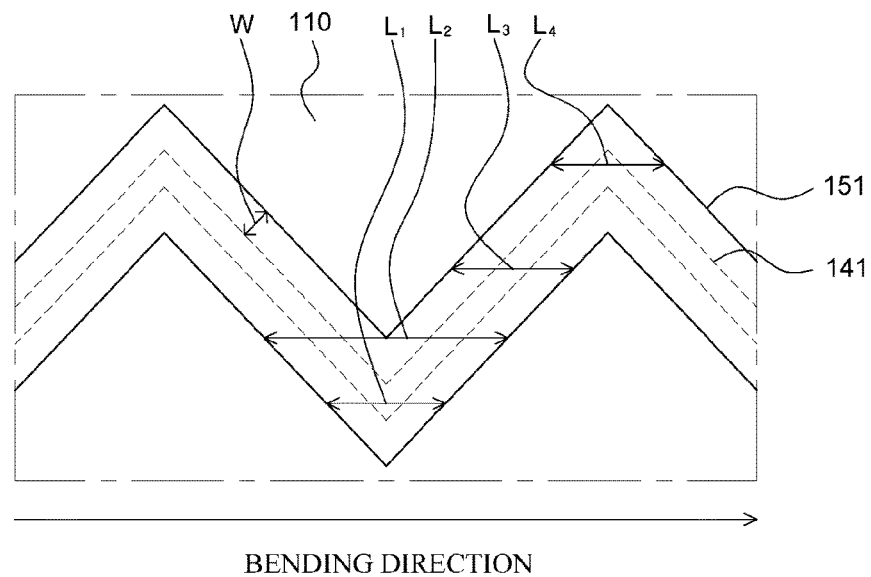
FIG. 1C is an enlarged view of an exemplary pattern of a wire and an upper insulating layer at a bending area of the flexible OLED display according to an exemplary embodiment of the present disclosure.

FIG. 1C is an enlarged view for describing the trace pattern of the wire pattern 141 and the insulating patterns (e.g., 131, 151) in the bending area of a flexible substrate 110 prior to being curved up or downwards in the bending direction. The lower insulating pattern (e.g., 131) is not illustrated in this plan view, but it should be appreciated that the lower insulating pattern is formed between the flexible substrate 110 and the wire 141.

Generally, the longer the portion being extended in the bending direction, the higher the chance of crack in that portion. Relatively greater mechanical stress will be experienced by these elements if more portions of such elements are in-line with the bending direction. Accordingly, it is preferable to reduce the length of the lower insulating pattern (e.g., 131, 132 and 133) the wire (e.g., 141, 142 and 143) and the upper insulating patterns (e.g., 151, 152 and 153) that extend parallel to the bending direction.

For this reason, the wire 141 and the insulating layers on the bending area are formed in the zigzag trace pattern as depicted in FIG. 1C to reduce the size of those elements being laid in parallel with the bending direction. In this configuration, at least some parts of the lower insulating pattern 131 and at least some parts of the upper insulating pattern 151 are also arranged non-parallel to the bending direction of the flexible substrate 110. Accordingly, mechanical stress to the lower insulating pattern 131 and the upper insulating pattern 151 is reduced, thereby inhibiting cracks from the outset.

Although the width (W) of the upper insulating patterns 151 is sufficient to cover the wire 141, its width should not be too large to turn the upper insulating pattern 151 into a straight line extending in the bending direction. In other words, the width of the upper insulating pattern 151 should be narrow enough so that its layout substantially corresponds to the trace shape of the wire 141 (despite being larger in terms of size of the shape). For example, the wire 141 is formed in a triangle-wave trace shape pattern, the upper insulating pattern 151 is also formed over the wire 141 in the same triangle-wave trace shape pattern. By reducing the portions extending parallel to the bending direction, the strain to the upper insulating pattern 151 can be reduced in the similar manner as the wire 141. Similarly, the width of the lower insulating pattern (e.g., 131) should be narrow enough so that its layout on the flexible substrate 110 substantially matches the trace shape of the wire 141.

Even when the upper insulating layer 151 has the pattern corresponding to the trace shape of the wire 141, it is inevitable that some portions of the upper insulating pattern 151 will remain parallel to the bending direction. For instance, portions of the upper insulating pattern 151 are laid parallel to the bending direction with the respective lengths L1, L2, L3 and L4. In order to reduce the occurrence of cracks in the upper insulating pattern 151, it is preferable to decrease the lengths L1, L2, L3 and L4 of the upper insulating pattern 151 in the direction parallel to the bending direction. Particularly, it is important to reduce the length of the upper insulating pattern 151 with length L2 as that portion being the longest portion extending in the bending direction. This can be achieved by reducing the width of the upper insulating pattern 151 to the extent possible. In some embodiments, the width (W) of the upper insulating pattern 151 extending outward from one side of the wire 141 may be as low as 1.5 µm~2 µm. However, it should be noted that the width (W) may vary depending on the wire trace shape.

Even if a crack/fracture occurs in one part of the flexible OLED display 100, the spacing between each of the lower insulating patterns serves to contain the crack/fracture within the given area without being propagated into other areas. Similarly, the configuration inhibits propagation of a crack from one of the upper insulating pattern (e.g., 151) to another upper insulating pattern (e.g., 152) because of the space between the two insulating patterns. Accordingly, the chance of crack in the wire 140 originating from the lower insulating layer 130 and/or the upper insulating layer 150 is significantly lower than the case where the lower insulating layer 130 and/or the upper insulating layer 150 is formed over the entire bending area or the entire flexible substrate 110.

In the figures of the present disclosure, all of the wires (141, 142 and 143) on the flexible substrate 110 are illustrated as having the same trace design, but it should be appreciated that some or each one of the wires may have different trace design from the other wire(s). For instance, the wire 141 may have a triangle-wave trace pattern, the wire 142 may have a diamond trace pattern and the wire 143 may have a sine-wave trace pattern. Likewise, the lower insulating patterns 131, 132 and 133 and the upper insulating patterns 151, 152 and 153 may be patterned in different designs from others insulating patterns.

Figure 1D:
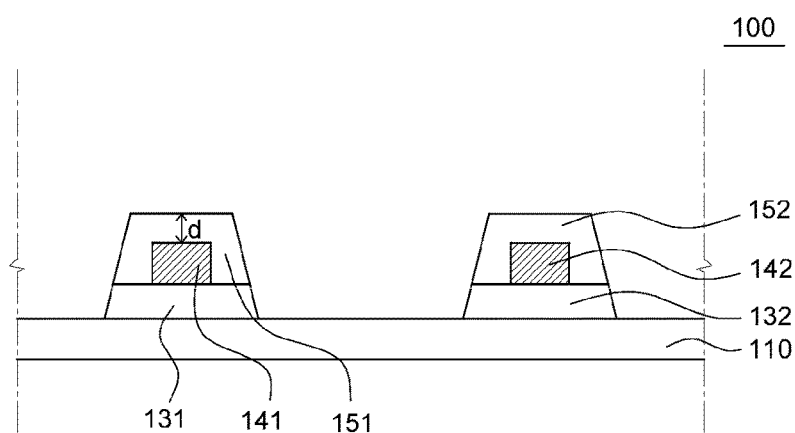
FIG. 1D is a cross-sectional view of the wires, the upper insulating layer and the lower insulating layer of the flexible organic light-emitting display along Ib-Ib' of FIG. 1B.

Referring to FIG. 1D, the thicknesses (d) of the upper insulating layer 150 (151, 152 and 153) can range from 100 angstroms to 5000 angstroms. The thicknesses of the lower insulating patterns (131, 132 and 133) may or may not be the same as the upper insulating layer 150. Similarly, the thicknesses of the individual upper/lower insulating patterns may vary from each other.

Figure 1E:
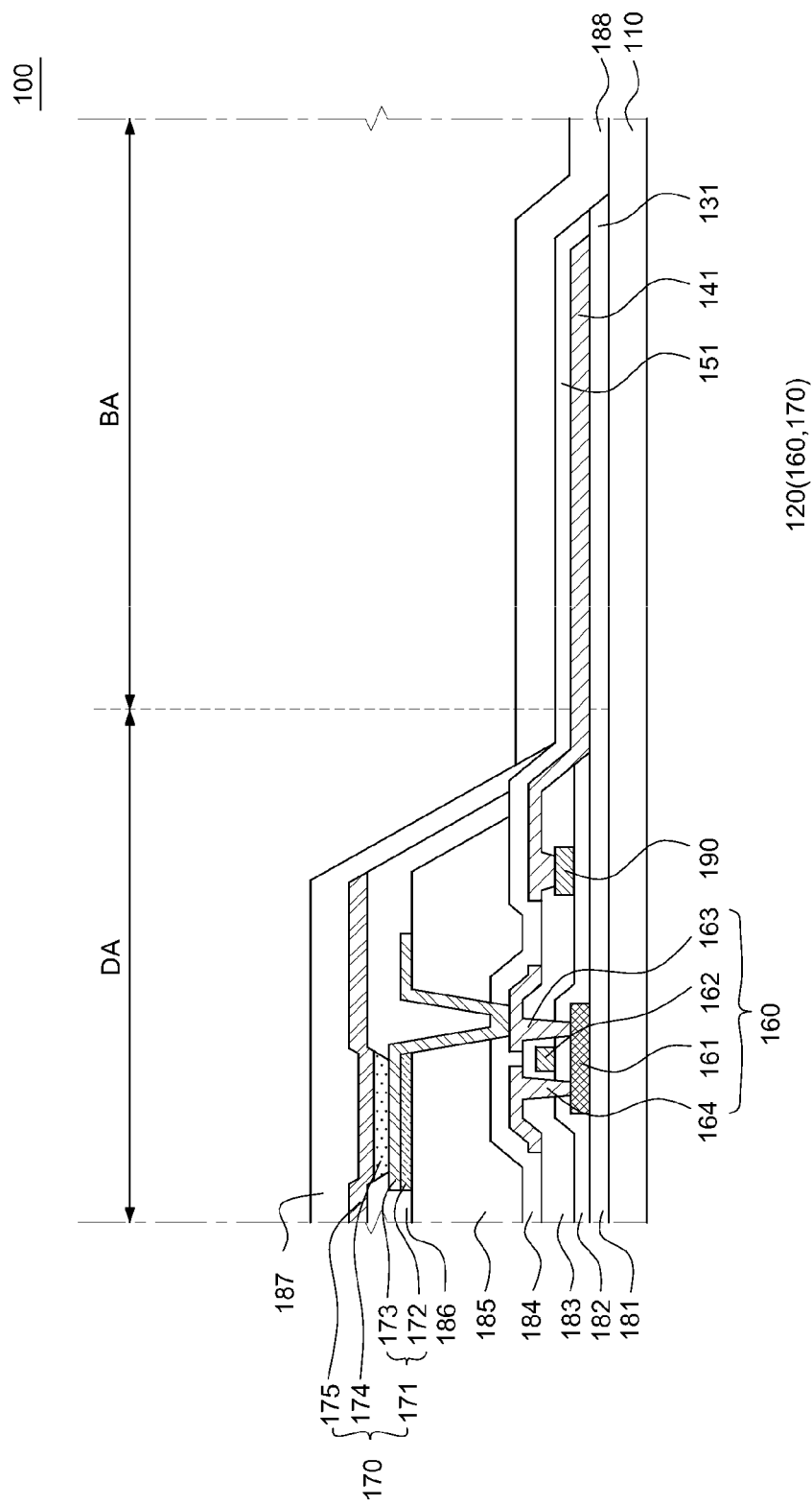
FIG. 1E is a cross-sectional view of a display unit, a wire, an upper insulating layer, a lower insulating layer and a protective layer of a flexible OLED display taken along Ie-Ie' of FIG. 1B.

FIG. 1E is a cross-sectional view illustrating the display unit 120 in the display area and the lower insulating layer 130, wire 140, upper insulating layer 150 and a protective layer 188 in the bending area of the flexible display 100, which is taken along Ie-Ie' of FIG. 1B. The display unit 120 including a thin-film transistor 160 and an OLED element 170 is formed in a display area DA of a flexible substrate 110. The thin-film transistor 160 includes an active layer 161 formed on a buffer layer 181, a gate electrode 162 formed on a gate insulating layer 182, a source electrode 163 and a drain electrode 164 that are formed on an interlayer insulating layer 183. A passivation layer 184 protects the thin-film transistor 160 from the external environment, and an overcoat layer 185 planarizes the surface over the thin-film transistor 160. The OLED element 170 includes an anode 171, an organic emissive layer 174 formed on the anode 171, and a cathode 175 formed on the organic emissive layer 174. The anode 171 is electrically connected to the source electrode 163 via contact holes through the overcoat layer 185 and the passivation layer 184. The anode 171 can include a reflective layer 172 and a transparent conductive layer 173, and a bank 186 can be formed to cover the side surface of the anode 171.

A connection part 190 is formed in the display area of the flexible substrate 110. The connection part 190 facilitates the electrical connection between any element of the display unit 120 and the wire 140 (e.g., first wire 141, second wire 142 and third wire 143). In FIG. 1E, the connection part 190, which is connected to the wire 141, is formed of the same material as the gate electrode 162. However, the connection part 190 can be formed of the same material as any one of various other conductive elements formed on the display area (e.g., source electrode 163, drain electrode 164, anode 171, cathode 175, gate line, etc.).

The wire 140 may be formed with a conductive material having excellent ductility. Examples of materials for forming the wire 140 may include gold (Au), silver (AG), aluminum (Al) and the like. The material for the wire 140 is not limited to the aforementioned materials, and the material for a wire may be the same material as that of one of various conductive elements formed in the display area of the flexible substrate 110. Although the wire 141 is illustrated as being formed of the same material as the source electrode 163 and the drain electrode 164 in FIG. 1E, it can be formed of the same material as anyone of various conductive elements formed in the display area. For example, the wire may be made with the same material as the source electrode 163, drain electrode 164, anode 171, cathode 175, gate line, etc. The material for a wire may be molybdenum (Mo), chrome (Cr), titanium (Ti), nickel (Ni), neodymium (Ne), copper (Cu), and an alloy of silver (Ag) and magnesium (Mg). The material for a wire may have a three-layer structure of titanium (Ti), aluminum (Al) and titanium (Ti), or a multi-layer structure including various conductive materials. The wire 140 and the elements being formed of the same material may be formed about the same time during the manufacturing of the flexible OLED display 100.

Also, in some embodiments, the flexible display may include a touch sensor (not shown) for recognizing touch input. The touch sensor may require many wires/electrodes (e.g., sensing electrode, driving electrode) that may cross over from the display area to the bending area. Accordingly, the wire 140 of the present disclosure can be used for the touch sensor.

The lower insulating layer 130 (e.g., first lower insulating layer 131, second lower insulating layer 132 and third lower insulating layer 133) and the upper insulating layer 150 (e.g., first upper insulating layer 151, second upper insulating layer 152 and third upper insulating layer 153) are made of the same material as any one of various insulating layers formed in the display area. For example, when the wire 141 is made of the same material as the source/drain electrodes, the lower insulating pattern 131 of the lower insulating layer 130 may be formed of the same material as the buffer layer 181, and the upper insulating pattern 151 may be formed of the same material as that of the passivation layer 184. Fabricating two elements with the same material makes it possible to form the two elements simultaneously, thereby reducing the complexity and time for manufacturing the flexible OLED display 100.

As depicted in FIG. 1E, a protective layer 188 (e.g., which may be a cover glass) is additionally formed over the bending area of the flexible substrate 110 to protect the elements formed thereunder. Since a crack in the protection layer 188 can propagate into the upper insulation layer 150, appropriate measure must be taken. For instance, the material for forming the protective layer 188 may be less brittle than the material for the upper insulation layer 150. The protective layer 188 may be made of a polymer sheet, for example, urethane acrylates. Also, the protective layer 188 may be made of the same material as the flexible substrate 110, and may also have the same thickness as that of the flexible substrate 110 (e.g., 25 µm or more). Further, the protective layer 188 and the upper insulating layer 150 can be spaced apart from each other by a distance sufficient to inhibit propagation of cracks.

It should be appreciated that the flexible OLED display 100 shown in FIG. 1E is merely illustrative. Although the thin-film transistor 160 having an n-type coplanar structure has been illustrated in FIG. 1, the type and structure of the thin-film transistor 160E is not particularly limited. Further, while the OLED element 170 of a top emission type has been illustrated in FIG. 1F, the flexible OLED display 100 can be formed with the OLED element of a bottom emission type.

Although FIG. 1E has illustrated that the lower insulating pattern 131 is made of the same material as that of the buffer layer 181, when the wire 141 is made of the same material as those of the source electrode 163 and the drain electrode 164, the lower insulating pattern 131 may be made of the same material as that of at least one of the gate insulating layer 182 and the interlayer insulating layer 183, which are formed in the display area of the flexible substrate 110.

In FIG. 1E, it has been illustrated that the wire 141 is made of the same material as those of the source electrode 163 and the drain electrode 164, but the wire 140 may be made of the same material as that of the gate electrode 162. When the wire 140 is made of the same material as that of the gate electrode 162, the connection part 190 may be made of the same material as those of the source electrode 163 and the drain electrode 164. Furthermore, when the wire 140 is made of the same material as that of the gate electrode 162, the upper insulating layer 150 may be made of the same material as that of at least one of the interlayer insulating layer 183 and the passivation layer 184 that are formed in the display area of the flexible substrate 110, and the lower insulating layer 130 may be made of the same material as that of at least one of the buffer layer 181 and the gate insulating layer 182, which are formed in the display area of the flexible substrate 110.

While the embodiment above is described with OLED display unit, it should be noted that the display unit of the flexible display can be implemented with other types of display technology, such as liquid crystal display (LCD), electrophoretic, and the like. When LCD is used, a liquid crystal layer may be disposed in the display area. A light source for the liquid crystal layer may be formed on the flexible substrate 110 (e.g., bent edge portion) or outside the flexible substrate 110. To provide light to the display area of the flexible substrate 110, a light guide member (e.g., flexible light guide panel or plate) may be used.

In the exemplary flexible OLED display 100 shown in FIGS. 1A through 1E, the lower and upper sides of the wire 140 are covered by the insulating layers (130, 150) on the respective sides. However, given that the insulating layers may be less ductile than the wire 140, reducing the size of the area covered by the insulating layers can further decrease the chance of crack propagation. Accordingly, complete elimination of the insulating layers would be the best in terms of managing the crack propagation to the wire 140. In cases where at least some parts of the wire 140 needs insulating layers, the size of the insulating layer can be minimized to the extent possible to cover only the portion of the wire 140 requiring the insulating layer.

To this end, eliminating, or otherwise reducing, the insulating layer on the lower side of the wire 140 is more feasible since the flexible substrate 110 may also serve as an insulating layer. As such, in some embodiments of flexible OLED display 100, the lower insulating layer 130 may be an optional element, and the wire 140 can be formed on the flexible substrate 110 without the lower insulating layer 130. In some other embodiments, the lower insulating layer 130 may be arranged to cover only portions of the wire 140.

Figure 2:
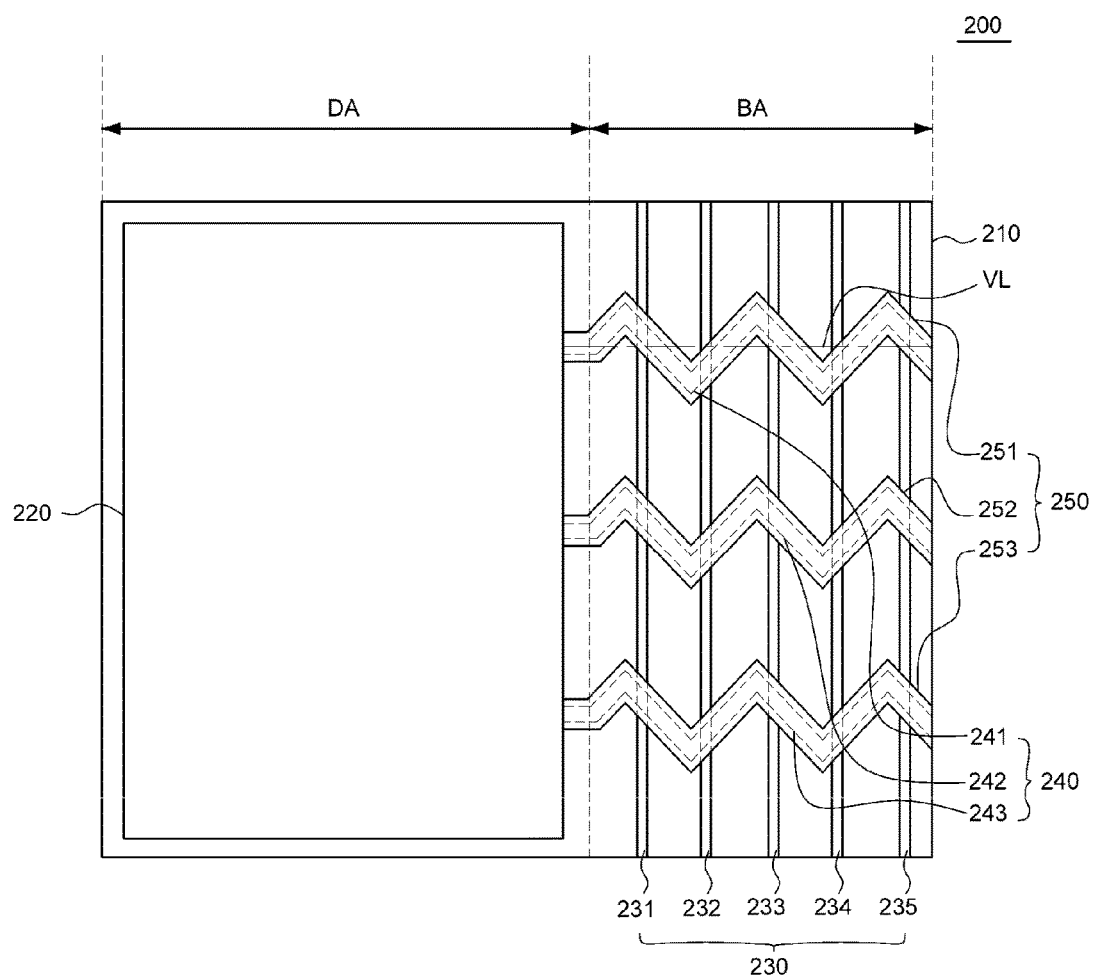
FIG. 2 is a plan view of an exemplary configuration of wires, upper insulating layers and lower insulating layers in a flexible OLED display according to another embodiment of the present disclosure.

FIG. 2 illustrates another exemplary configuration of the lower insulating layer arranged to reduce the occurrences of crack propagation to the wire. In this configuration, the lower insulating layer 230 is formed as stripes laid across the bending area of the flexible substrate 210. The lower insulating layer 230 includes a plurality of lower insulating patterns (e.g., 231, 232, 233, 234 and 235) arranged non-parallel to the direction of which the wire 140 generally extends out in the bending area, which is depicted as a virtual straight line (VL) from two opposite ends of the wire 240 in the bending area.

In such a configuration, only some portions of the wire 240 would be covered by the lower insulating patterns 231, 232, 233, 234 and 235. In terms of protecting, or otherwise insulating, the wire 240, the configuration of the lower insulating layer 230 may not be as effective as the configuration of the lower insulating layer 130 in FIG. 1B. On the other hand, the chance of crack propagation from the lower insulating layer 230 to the wire 240 can be reduced. When required, the width of the each lower insulating patterns 231, 232, 233, 234 and 235 can be increased so that the parts of the wire 240 that need protection can be covered at the expense of increased chance of crack propagation.

Arranging the lower insulating patterns 231, 232, 233, 234 and 235 perpendicular to the bending direction would reduce the strain on them from bending of the flexible substrate 210, and reduce the cracks generation on the outset. As such, this configuration is well suited in the area where the bending direction of the flexible substrate 210 is fixed, such as the edges of the flexible substrate 210.

Figure 3:
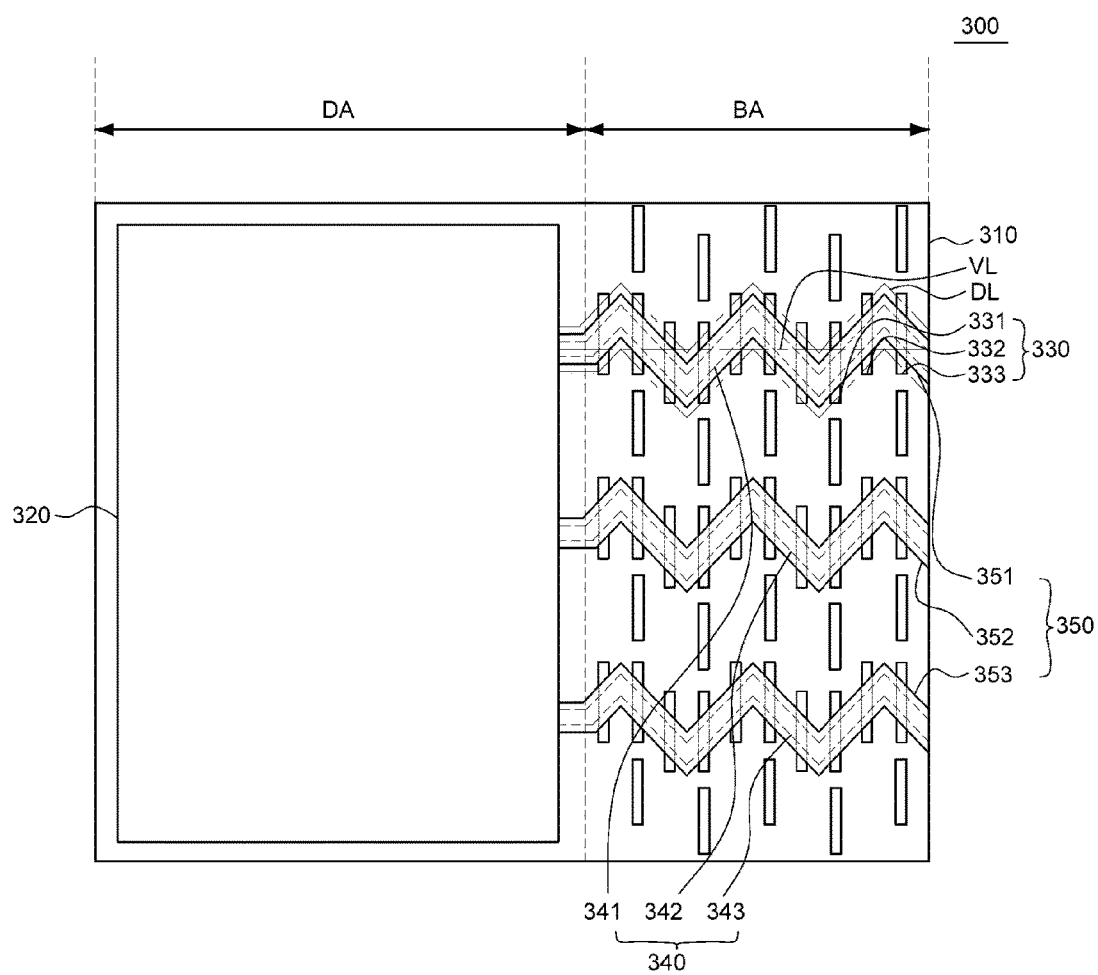
FIG. 3 is a plan view of an exemplary configuration of wires, upper insulating layers and lower insulating layers in a flexible OLED display according to another embodiment of the present disclosure.

FIG. 3 illustrates yet another exemplary configuration of the lower insulating layer arranged to reduce the occurrences of crack propagation to the wire. Unlike the lower insulating layer 230 shown in FIG. 2, which is formed as continuous stripes laid across the bending area, the lower insulating layer 330 is formed of discontinuous pieces, such that several pieces (e.g., 331, 332, and 333) of the insulating layer 330 are arranged along the trace pattern of the wire 340 which is denoted as "DL." The number of discontinuous pieces along a single wire trace pattern (e.g., 341, 342 and 343) is not particularly limited. Also, the number of pieces along one of the wire trace pattern may be different from the number of pieces along another wire trace pattern. In this way, propagation of the crack to the wire 340 via the lower insulating layer 330 can be reduced even further.

Figure 4A:
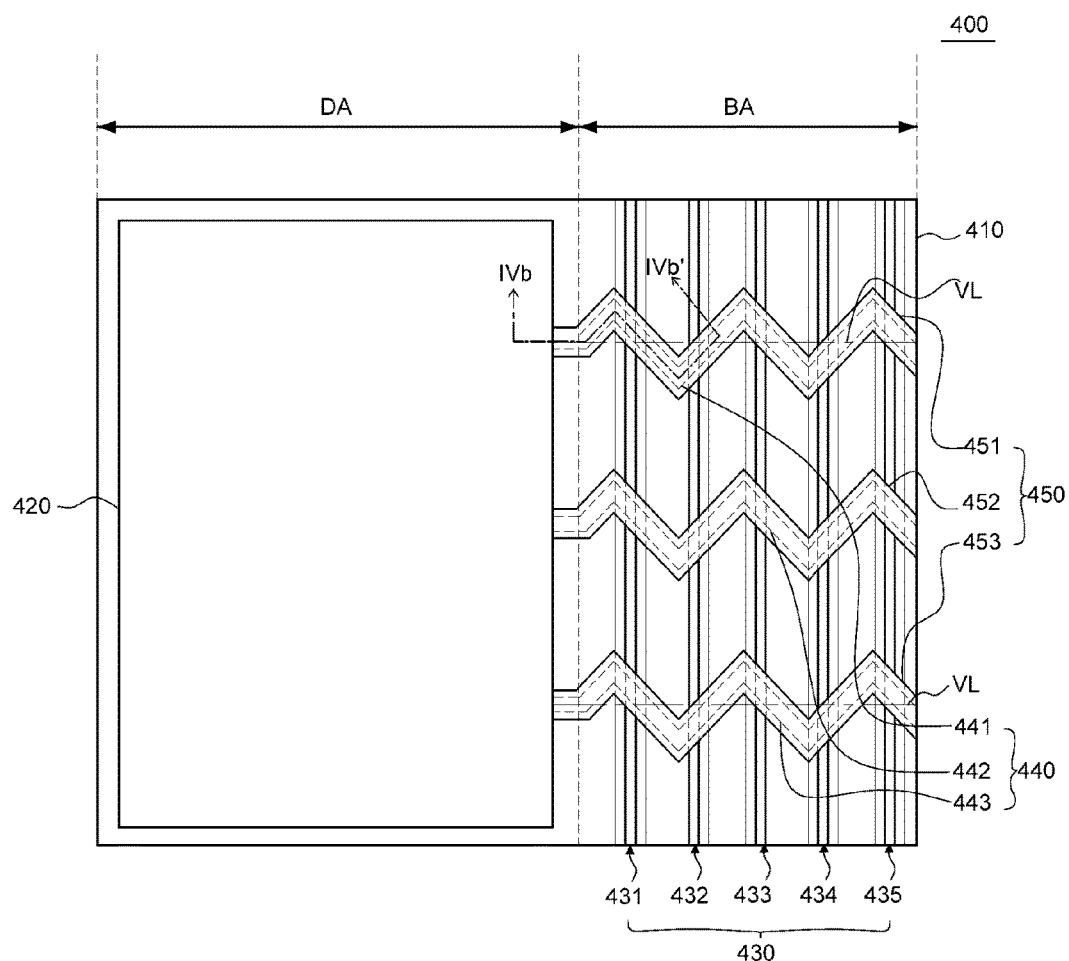
FIG. 4A is a plan view of an exemplary configuration of wires, upper insulating layers and lower insulating layers in a flexible OLED display according to yet another embodiment of the present disclosure.
Figure 4B:
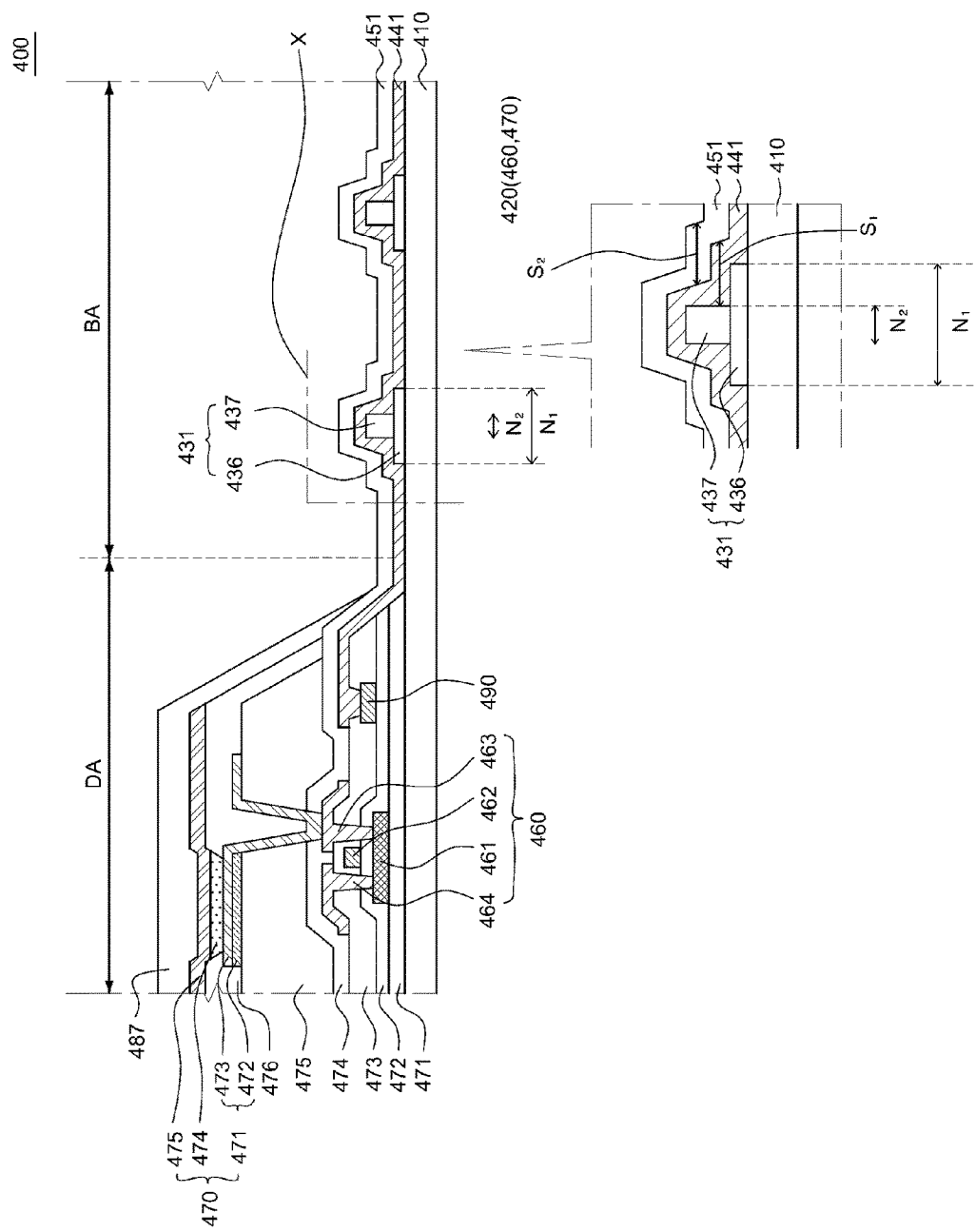
FIG. 4B is a cross-sectional view a flexible OLED display taken along the line IVb-IVb' of FIG. 4A.

FIG. 4A is a schematic plan view illustrating yet another exemplary configuration of a lower insulating layer, wires and an upper insulating layer of a flexible OLED display according to an embodiment of the present disclosure. FIG. 4B illustrates a cross-sectional view of the flexible OLED display of FIG. 4A along the line IVb-IVb'. The flexible OLED display 400 is different from other embodiments in the present disclosure in that each of the lower insulating patters (e.g., 431, 432, 433, 434 and 435) is formed as a stack of two insulating layers. For example, the lower insulating pattern 431 includes a first base insulating layer 436 and a second base insulating layer 437. Other elements depicted in FIGS. 4A and 4B are substantially the same as the corresponding elements in FIG. 1E, and thus the descriptions thereof will be omitted for brevity.

The first base insulating layer 436 and the second insulating layer 437 may be made of the same material as that of any one of insulating layers formed in the display area. For example, when the wire 441 is made of the same material as those of the source electrode 463 and the drain electrode 464, the first base insulating layer 436 may be made of the same material as that of any one of insulating layers, such as the buffer layer 481, the gate insulating layer 482, and the interlayer insulating layer 483. In addition, the second base insulating layer 437 can be made of the same material as any one of the insulating layer other than the one used in forming the first base insulating layer 436.

The cross-sectional width N1 of the first base insulating layer 436 is wider than the cross-sectional width N2 of the second base insulating layer 437, and thus the lower insulating pattern 431 has a stair-like structure. When the wire 441 is formed on the lower insulating layer 430, the stair-like structure of individual lower insulating patterns creates stepped portions in the wire 441 (i.e., the segment length S1), which are at a different plane level from other portion of the wire 441. Further, the stair-like structure of the lower insulating layer 430 also creates stepped portions (e.g., a segment length S2) in the upper insulating layer 451 along the stepped surface of the wire 440. Here, the segment length refers to a length of a continuous portion of an element on the same plane. The shorter segments of the wire 440 and the upper insulating layer 450 provide strain diffusing parts for the mechanical stress from bending of the flexible substrate 410. Accordingly, crack/fracture generation in the wire 440 and the upper insulating layer 450 can be reduced with the lower insulating layer 430 having the stair-like structure.

Although it has been illustrated that the lower insulating layer 430 is formed as one continuous pattern in FIG. 4A, the lower insulating layer 430 may be formed of discontinuous pieces similar to the example described with FIG. 3 above. In this case, both of the first base insulating layer 436 and the second base insulating layer 437 of the lower insulating layer 430 may be formed as the discontinuous pieces, or only one of the first base insulating layer 436 and the second base insulating layer 437 may be formed as the discontinuous pieces.

While the lower insulating layer 430 has illustrated as being formed with the first base insulating layer 436 and the second base insulating layer 437, the number of insulating layers creating the stair-like structure of the lower insulating layer 430 is not limited as such. For example, the lower insulating layer 430 can be formed of three or more insulating layers to create the stair-like structure with more number of steps to generate even shorter segments in the wire 440 and the upper insulating layer 450.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A flexible organic light emitting diode (OLED) display, comprising:
   a flexible substrate having a display area and a bending area adjacent to the display area;
   a display unit in the display area of the flexible substrate, the display unit having a thin-film transistor and an OLED element;
   a wire electrically connected to the display unit in the display area and extending into the bending area of the flexible substrate, the wire having a trace pattern arranged in an orthogonal direction relative to a boundary between the display area and the bending area of the flexible substrate;
   an upper insulating pattern on the wire, the upper insulating pattern having substantially the same trace pattern as the wire thereunder; and a lower insulating layer between the flexible substrate and the wire in the bending area, wherein the lower insulating layer includes a lower insulating pattern extending non-parallel to a general direction in which the wire extends from the display area to the bending area, wherein the lower insulating layer has a plurality of discontinuous pieces of the lower insulating pattern separated from each other.

2. The flexible OLED display according to claim 1, wherein the wire and the upper insulating layer are in direct contact with each other.

3. The flexible OLED display according to claim 1, wherein the wire is made of the same material as at least one of a gate electrode, a source electrode and a drain electrode of the thin-film transistor.

4. The flexible OLED display according to claim 3, wherein the wire is made of the same material as that of the gate electrode, the upper insulating layer and at least one of an interlayer insulating layer and a passivation layer of the display unit being made of the same material, and the lower insulating layer and at least one of a buffer layer and a gate insulating layer being made of the same material.

5. The flexible OLED display according to claim 3, wherein the wire is made of the same material as at least one of the source electrode and the drain electrode, the upper insulating layer and a passivation layer in the display unit being made of the same material, and the lower insulating layer and at least one of a buffer layer, a gate insulating layer and an interlayer insulating layer being made of the same material.

6. The flexible OLED display according to claim 1, wherein the trace pattern of the wire is at least one of a diamond trace pattern, a triangle-wave trace pattern, a sine-wave trace pattern and a trapezoid-wave trace pattern.

7. The flexible OLED display according to claim 1, further comprising:

a protective layer on the upper insulating layer in the bending area.

8. The flexible OLED display according to claim 1, wherein the wire serves as a touch sensor for the flexible OLED display.

9. The flexible OLED display according to claim 1, further comprising:

a cover glass on the display area and/or the bending area of the flexible OLED display.

10. The flexible OLED display according to claim 1, wherein the lower insulating pattern has at least two base insulating layers of different sizes being stacked on each other.

11. The flexible OLED display according to claim 10, wherein the at least two base insulating layers have a first base insulating layer and a second base insulating layer, and the cross-sectional width of the first base insulating layer is wider than the cross-sectional width of the second base insulating layer.

12. The flexible OLED display according to claim 10, the lower insulating pattern has a stair-like structure.

* * * * *